United States Patent [19]
Pedersen

[11] Patent Number: 5,649,163
[45] Date of Patent: Jul. 15, 1997

[54] METHOD OF PROGRAMMING AN ASYNCHRONOUS LOAD STORAGE DEVICE USING A REPRESENTATION OF A CLEAR/PRESET STORAGE DEVICE

[75] Inventor: Bruce B. Pedersen, Santa Clara, Calif.

[73] Assignee: Altera Corporation, San Jose, Calif.

[21] Appl. No.: 319,333

[22] Filed: Oct. 6, 1994

Related U.S. Application Data

[63] Continuation of Ser. No. 968,598, Oct. 29, 1992, abandoned.

[51] Int. Cl.$^6$ ................................. G06F 9/455
[52] U.S. Cl. ................................. 395/500
[58] Field of Search ................... 395/500; 364/488, 364/489, 490, 578, 580

[56] References Cited

U.S. PATENT DOCUMENTS

| H1414 | 2/1995 | Borgen | 380/4 |
|---|---|---|---|
| 4,725,975 | 2/1988 | Sasaki | 395/500 |
| 4,916,627 | 4/1990 | Hathaway | 364/490 |
| 5,097,151 | 3/1992 | Eerenstein et al. | 326/46 |
| 5,109,353 | 4/1992 | Sample et al. | 364/578 |
| 5,189,629 | 2/1993 | Kohnen | 364/490 |
| 5,206,944 | 4/1993 | Pilkenton | 395/405 |
| 5,237,513 | 8/1993 | Kaplan | 364/490 |
| 5,260,611 | 11/1993 | Cliff et al. | 326/39 |
| 5,436,575 | 7/1995 | Pedersen et al. | 326/40 |
| 5,450,608 | 9/1995 | Steele | 395/800 |
| 5,473,266 | 12/1995 | Ahanin et al. | 326/41 |
| 5,513,141 | 4/1996 | Offord | 365/189.05 |
| 5,550,782 | 8/1996 | Cliff et al. | 365/230.03 |

OTHER PUBLICATIONS

Altera Data Book, Sep. 1991, pp. 269–370.

*Primary Examiner*—Parshotam S. Lall
*Assistant Examiner*—Kenneth R. Coulter
*Attorney, Agent, or Firm*—Townsend and Townsend and Crew, LLP

[57] ABSTRACT

A method and apparatus for converting a storage device having asynchronous clear and asynchronous preset inputs into an equivalent storage device having asynchronous clear and asynchronous load inputs is provided. If the asynchronous clear/asynchronous preset flip-flop is fed by a preset signal but not a clear signal, the equivalent asynchronous clear/asynchronous load flip-flop is implemented by connecting the preset signal to the clear terminal of the asynchronous clear/asynchronous load flip-flop, disabling the load of the asynchronous clear/asynchronous load flip-flop and inverting the input and output signal of the asynchronous clear/asynchronous preset flip-flop. If both a clear and preset signal are fed to the asynchronous clear/asynchronous preset, the preset function can be reduced to (L*D), and the clear input can be reduced to (C+L*D'), then the flip-flop can be implemented by connecting C, L, and D, to the clear, asynchronous load and asynchronous data inputs of the asynchronous clear/asynchronous load flip-flop. If aforementioned conditions are not met, the asynchronous clear/asynchronous preset flip-flop is implemented by placing $V_{cc}$ on the asynchronous data input and connecting the preset signal of the asynchronous clear/asynchronous preset flip-flop to the asynchronous load input of the asynchronous clear/asynchronous flip-flop.

18 Claims, 5 Drawing Sheets

CLEAR/PRESET FF

| CLEAR | PRESET | CLOCK | SYNC DATA | Qn | Qn+1 |
|---|---|---|---|---|---|
| 1 | x | x | x | 0 | 0 |
| 0 | 1 | x | x | 1 | 1 |
| 0 | 0 | 0->1 | 0 | Qn | 0 |
| 0 | 0 | 0->1 | 1 | Qn | 1 |
| 0 | 0 | 1->0 | x | Qn | Qn |

FIGURE 3 (Prior Art)

CLEAR/LOAD FF

| CLEAR | LOAD | ASYNC DATA | CLOCK | SYNC DATA | Qn | Qn+1 |
|---|---|---|---|---|---|---|
| 1 | x | x | x | x | 0 | 0 |
| 0 | 1 | 0 | x | x | 0 | 0 |
| 0 | 1 | 1 | x | x | 1 | 1 |
| 0 | 0 | x | 0->1 | 0 | Qn | 0 |
| 0 | 0 | x | 0->1 | 1 | Qn | 1 |
| 0 | 0 | x | 1->0 | x | Qn | Qn |

METHOD OF PROGRAMMING AN ASYNCHRONOUS LOAD STORAGE DEVICE USING A REPRESENTATION OF A CLEAR/PRESET STORAGE DEVICE

This is a continuation of Ser. No. 07/968,598, filed Oct. 29, 1992, now abandoned.

BACKGROUND OF THE INVENTION

This invention relates to method and apparatus for converting a software representation of a first data storage circuit having a first type of input signals into an equivalent software representation of a second data storage circuit having a second type of input signals. In particular, the invention provides both hardware and software for implementing a macrocell with a storage device having both asynchronous clear and asynchronous load inputs based on design data being supplied for a different device, one in which the inputs for a data storage device are asynchronous clear and asynchronous preset.

Programmable logic devices combine the advantages of standard, mass producible integrated circuits with the architectural flexibility of custom devices. Altera Corporation manufactures programmable logic devices which provide user-configurable input/output pins, programmable configurability, and clock options that ensure maximum flexibility for integrating random logic functions. The fundamental building block of an Altera programmable logic device is the macrocell.

FIG. 1 illustrates a standard macrocell used in some of the MAX product line devices manufactured by Altera. Although this is one example of a macrocell, it will be apparent that many other macrocells could be used having similar or dissimilar structures. The macrocell 100 consists of a logic array 110, a programmable register (or flip-flop) 112, and programmable input/output connections 114. The programmable register may be programmed to provide a conventional D, T, JK or SR function. The register 112 has an asynchronous clear and asynchronous preset capability that allows complete emulation of many TTL functions. Other commercially available programmable logic devices incorporate similar macrocells and registers.

FIG. 2 illustrates a macrocell 200 used in the Altera FLEX programmable logic device. The Altera Flex programmable logic is an SRAM-based programmable logic device more fully described in commonly assigned pending application Ser. No. 880,942, filed May 8, 1992, now U.S. Pat. No. 5,260,611. Unlike the previously described macrocells, the Altera Flex macrocell 200 does not include an asynchronous preset input. Instead, the macrocell 200 is implemented using a programmable register 210 having asynchronous clear 212 and asynchronous load 214 inputs. An advantage of using an asynchronous load input instead of an asynchronous preset input is that a group of macrocells may share a common load signal. If a design requires asynchronously loading a group of registers having only clear and preset inputs, unique logic must be created for every similarly configured register. A dedicated load line allows this function to be performed without adding extra combinatorial logic for each register.

FIGS. 3 and 4 are the function tables corresponding to the programmable registers shown in FIGS. 1 and 2 respectively. The table shown in FIG. 3 is for a programmable flip-flop having active high clear and preset signals as inputs. The table shown in FIG. 4 is for a programmable flip-flop having active high clear and asynchronous load inputs. In both FIGS. 3 and 4, $Q_n$ is the output of the flip-flop prior to the clock transition and $Q_{n+1}$ is the output of the flip-flop after the clock transition.

Although the asynchronous clear/asynchronous load macrocell offers the advantage of a common load signal, many engineers and logic designers are not familiar with macrocells whose programmable registers do not include both asynchronous clear and asynchronous preset inputs. An engineer not familiar with an asynchronous clear/asynchronous load macrocell may find designing programmable logic using this alternative macrocell frustrating. Thus, a method and apparatus is needed whereby a hardware designer or user of programmable logic can design products using logic which includes storage devices having asynchronous clear and asynchronous preset inputs, but which logic is readily transferrable to a circuit using storage devices having asynchronous clear and asynchronous load inputs. The designer should be able to specify register inputs and interconnections based on a standard asynchronous clear/asynchronous preset type storage device. The method and apparatus for creating an equivalent storage device should be transparent to the user to avoid user frustration.

SUMMARY OF THE INVENTION

A method and apparatus for converting a representation of a storage device having asynchronous clear and asynchronous preset input signals into a representation of an equivalent storage device having asynchronous clear and asynchronous load input signals is provided. For convenience I term these two devices clear/load and clear/preset herein, because in both devices the input signals are asynchronous.

In one embodiment, the method and apparatus for converting the clear and preset signals for a first storage device into clear and load signals for a second device is dependent upon the voltage level of the clear/preset flip-flop input signals specified by the designer. If a clear/preset TTL flip-flop is connected to receive a preset signal but not a clear signal, the equivalent clear/load flip-flop is implemented by connecting the preset signal of the clear/preset flip-flop into the clear input terminal of the clear/load flip-flop, disabling the asynchronous load terminal of the clear/load flip-flop, and connecting the inverted input and inverted output of the clear/preset flip-flop to the corresponding input and output of the clear/load flip-flop.

Alternatively, if the inputs of the clear/preset flip-flop are connected to both a clear and preset signal, and if the preset function can be reduced to the logical expression (L'D), and if the clear input can be reduced to the logical expression (C+L*D'), then the clear/preset flip-flop can be implemented as follows. The C signal is connected to the clear input terminal of the clear/load flip-flop, the L signal to the load input terminal of the clear/load flip-flop and the D input signal is connected to the data input terminal of the clear/load flip-flop. If the input signal is not connected to both clear and preset signals and the clear and preset input signals cannot be reduced to the aforementioned logical expressions, the clear/preset flip-flop is converted to the clear/load flip-flop by coupling $V_{cc}$ to the data input terminal of the clear/load flip-flop and connecting the preset signal of the clear/preset flip-flop to the load terminal of the clear/load flip-flop.

For a fuller understanding of the nature and advantages of the invention, reference should be made to the following ensuing detailed description taken in conjunction with the accompanying drawings.

BRIEF DESCRIPTION OF THE DRAWINGS

FIG. 3 is a function table for the flip-flop illustrated in FIG. 1 having asynchronous clear and asynchronous preset signals as inputs;

FIG. 4 is a function table for the flip-flop illustrated in FIG. 2 having asynchronous clear and asynchronous load signals as inputs;

DESCRIPTION OF SPECIFIC EMBODIMENTS

Figure 1:
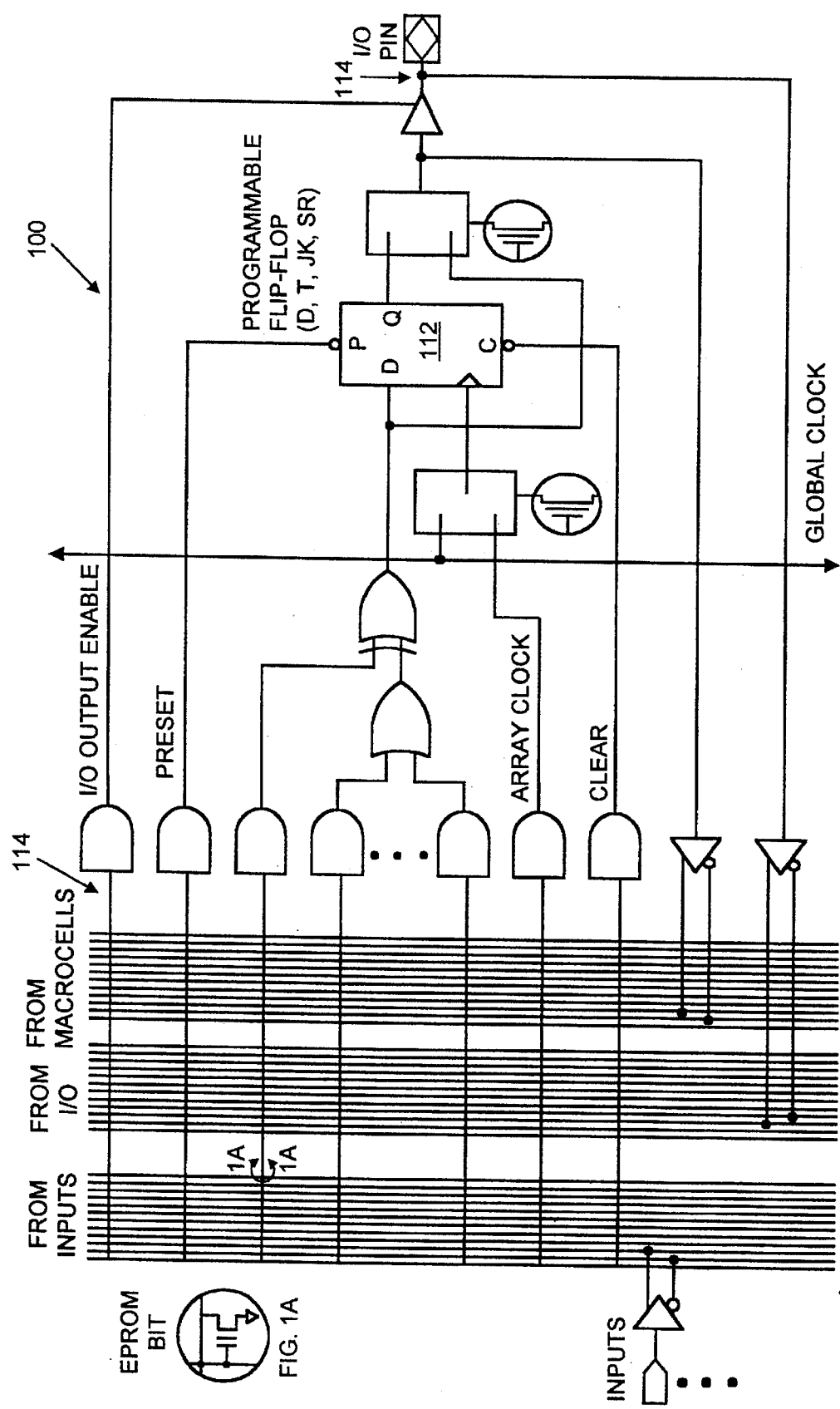
FIG. 1 is a block diagram of a macrocell having a flip-flop with asynchronous clear and asynchronous preset inputs.
Figure 2:
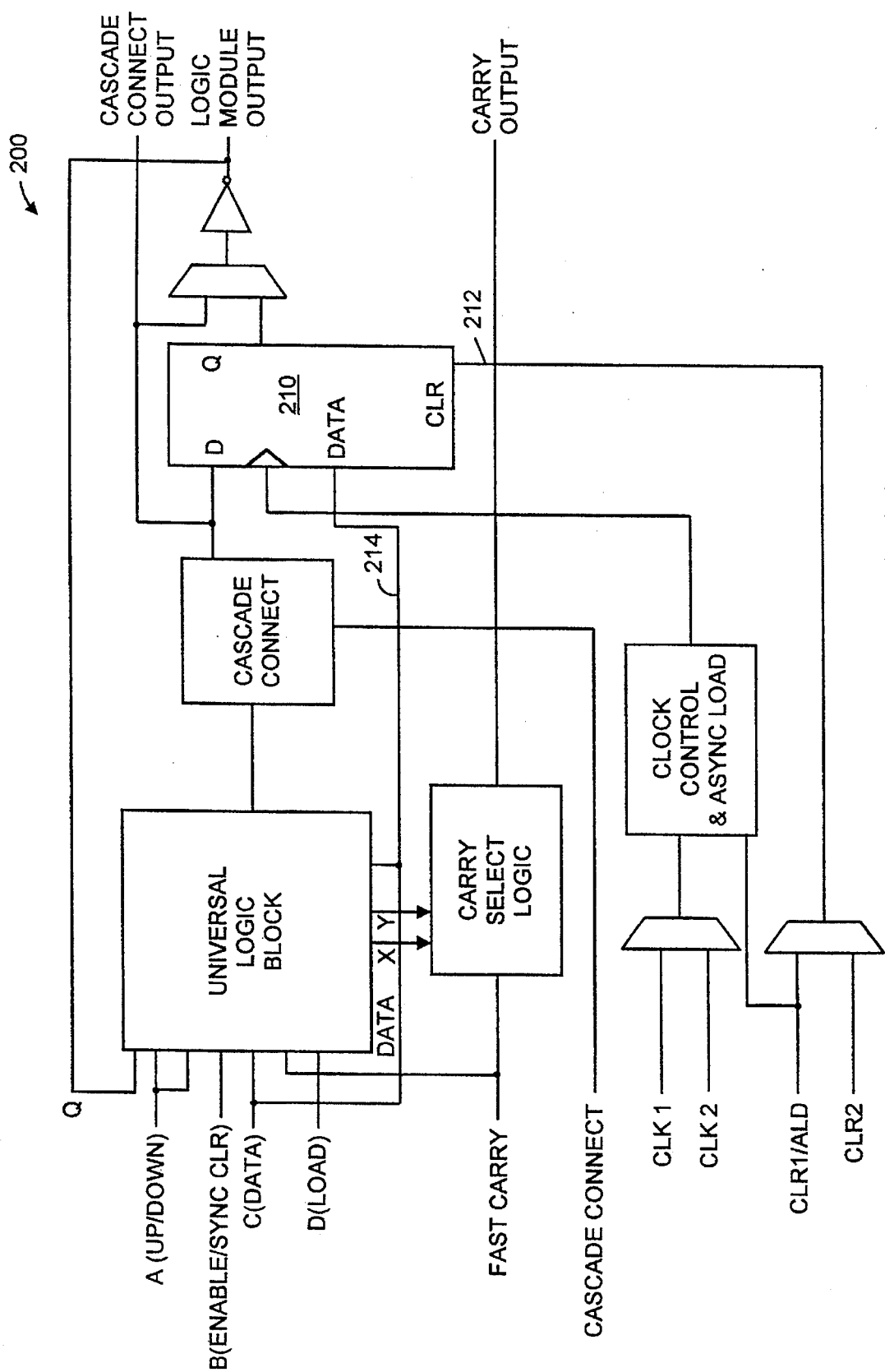
FIG. 2 is a block diagram of a macrocell having a flip-flop with asynchronous clear and asynchronous load inputs.
Figure 5:
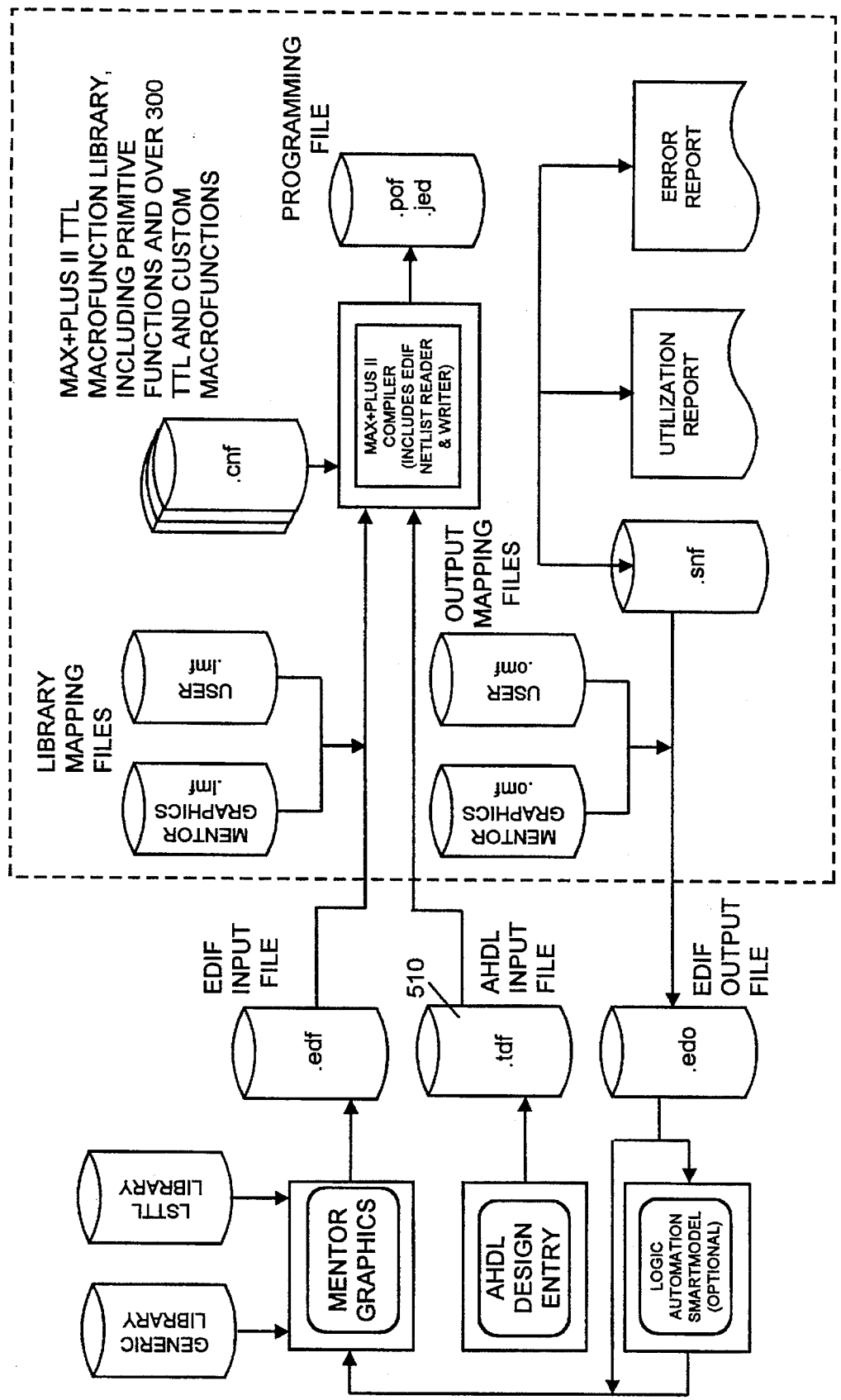
FIG. 5 is a system block diagram of computer software tools used in implementation of the conversion shown in the steps illustrated in FIG. 6.

In the preferred embodiment, my system for converting a storage device having asynchronous clear and asynchronous preset input signals into an equivalent storage device having asynchronous load and asynchronous clear signals is embedded in a design and simulation system for programmable logic device design. FIG. 5 is a system block diagram of the computer software tools used in a preferred embodiment for implementing this invention. The design and simulation system simulates the programmable logic device using a behavioral hardware description language, imports and exports design data, and analyzes simulation results. The system shown in FIG. 5 has been modularly designed and developed to be system independent, requiring minimal change to rehost on additional workstation platforms. It will be apparent to those of skill in the art that the method of this invention could be readily applied in any one of a variety of programming languages and on any one of a variety of workstations without departing from the scope of the invention.

In the preferred embodiment, the design and simulation system is implemented in the "C" programming language and is operational on the Apollo Systems, Inc. line of work stations. In particular, the software is operational on the Apollo Series 3000, 3500, 4000 and 4500 models, operating under the OS SR 10.3 operating system. Alternatively, the design and simulation system can be implemented on an HP4000 workstation.

The software used in the preferred embodiment for designing macrocell logic is MAX+PLUS II Windows based software, available from Altera Corporation, San Jose, Calif. Altera Hardware Description Language (AHDL) is the preferred hardware description language used. AHDL supports state machine, Boolean equation and truth table entry methods. MAX+PLUS II Windows 3.0 and AHDL are described in the publicly available Altera Data Book, Copyright 1991.

In customizing a programmable logic device chip, the design engineer uses MAX+PLUS II software to create a file to describe a particular hardware implementation which will carry out the desired logic function. The design may be entered into the system using a variety of entry methods including: Schematic Capture, Altera Hardware Description Language (AHDL), Waveform Entry, State Machine Entry, Boolean Equation Entry, Altera Assembly Language Entry, Table Entry, or other well known means.

In one embodiment, AHDL is used to create an AHDL input file 510 which includes a software representation of the macrocell. Because standard macrocells are composed of D, T, JK or SR flip flops, an asynchronous clear or preset signal is specified. Table 1 shows an AHDL file for a particular hardware implementation using a standard macrocell. The AHDL file shows a single D-type flip-flop with active high clear and preset being used in a design.

TABLE 1

FUNCTION DFF( in, clk, clm, pren ) RETURNS( q );
SUBDESIGN( Din, clock, clear, preset: INPUT; Q: OUTPUT;)

VARIABLE register: DFF;
BEGIN
    Q = register.q;
    register.clk = clock;
    register.clm = !clear;
    register.pren = !preset;
    register = Din;
END;

As can be seen from the preceding AHDL file, the asynchronous clear/asynchronous load register does not explicitly appear in the Altera AHDL design language. When the above design is compiled for a device having a clear/load register, the clear/preset register used by the designer will be automatically converted to use the clear/load signals of the actual register. The fact that a clear/load macrocell is used is transparent to the designer.

Figure 6:
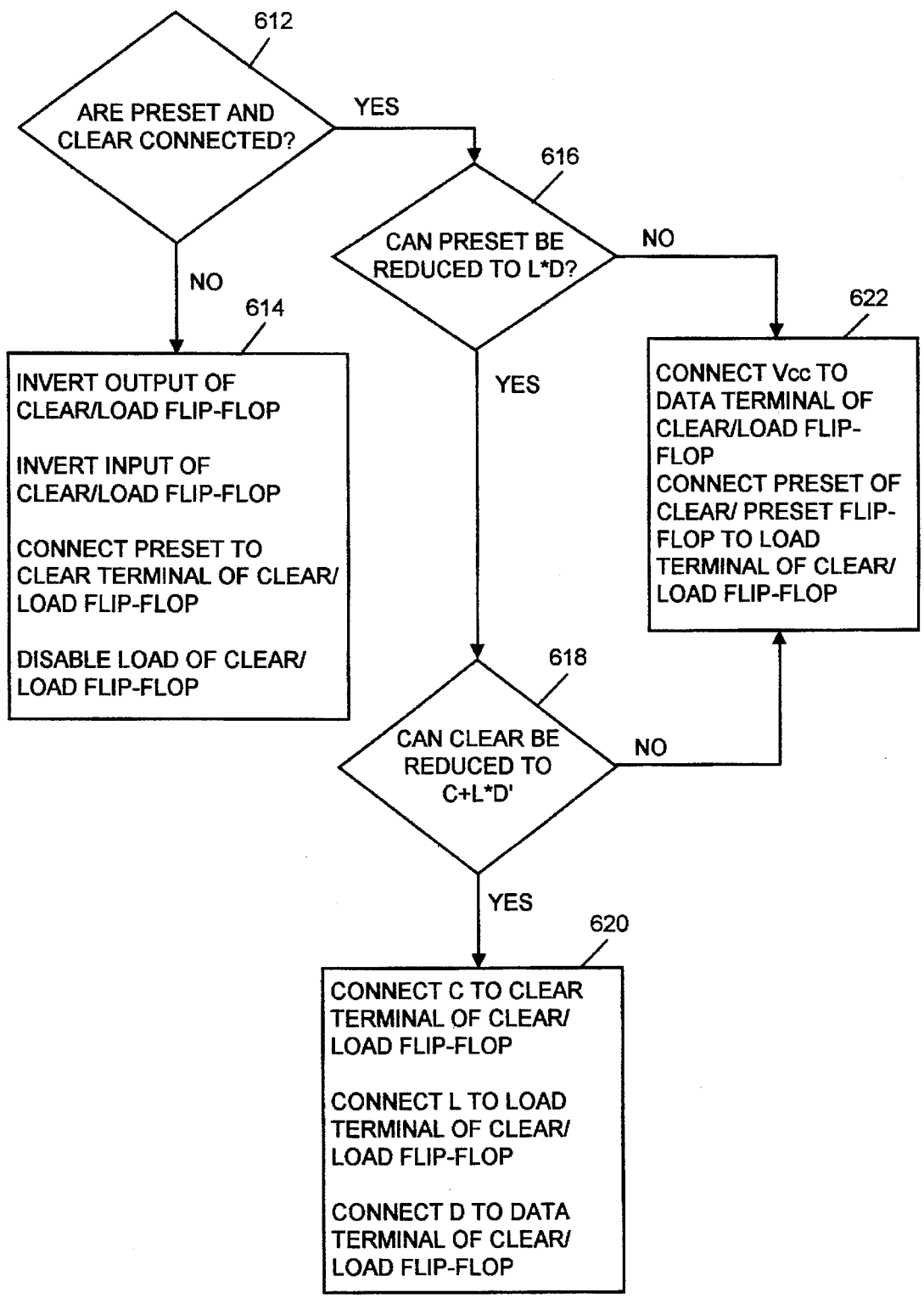
FIG. 6 is a flowchart illustrating the steps for converting a representation of a storage device having asynchronous preset and asynchronous clear inputs into an equivalent storage device having asynchronous clear and asynchronous load inputs.

In a preferred embodiment, the conversion of a representation of a standard asynchronous clear/asynchronous preset flip flop into a representation of an asynchronous clear/asynchronous load type flip-flop follows the steps shown in FIG. 6. The method for converting the asynchronous clear and asynchronous preset signals for a first storage device into asynchronous clear and asynchronous load signals for a second storage device is dependent upon the voltage level of the asynchronous clear and asynchronous preset macrocell inputs specified by the designer.

The first step 612 in the conversion process is determining whether both the preset signal and the clear signal are connected to the asynchronous clear/asynchronous preset flip-flop. If the flip-flop is not connected to both a preset signal and a clear signal, the equivalent asynchronous clear/asynchronous load flip-flop is implemented by step 614. In this case, the preset signal is connected to the clear input terminal of the asynchronous clear/asynchronous load flip-flop, the load terminal for the asynchronous clear/asynchronous load flip-flop is disabled, and the inverted input and inverted output signals of the asynchronous clear/asynchronous preset flip-flop are connected to the corresponding input and output of the asynchronous clear/asynchronous load flip-flop.

Steps 616 and 618 check if the clear input $C_0$ and preset input $P_0$ can be reduced to the logical subexpressions C, L and D. The logical subexpressions C, L, and D may be derived from $C_0$ and $P_0$ according to the steps shown in Table 2.

TABLE 2

Let $P_0$ be an active high preset signal.
Let $C_0$ be an active high clear signal.
Let REDUCE(f,d) be a function that expands the Sum-Of-Products function f into a non-redundant set of prime implicants using the function d as a Don't Care set.
Then L = REDUCE($P_0$, $C_0$);
Let L' = The logical complement of L
Then D = REDUCE($P_0$, L'); and
Then C = REDUCE($C_0$,L').

The function REDUCE(f,d) may be implemented by expanding the functions d and (f∪d) into prime implicants using the method of iterative consensus, and then deleting from the expanded function (f∪d) those product terms appearing in the expanded function d to get the desired result.

The clear $C_0$ and preset $P_0$ input signals which reduce to $C_0=C+L*D'$ and $P_0=L*D$ may also reduce to other equivalent permutations, for example, $C_0=C+L*D$ and $P_0=L*D,C'$, as well as other equivalent permutations derived from the commutative and associated rules of Boolean algebra. Equivalent permutations may be derived using a standard graph/tree matching algorithm.

If the flip-flop receives both a clear and preset signal, and the preset signal $P_0$ can be reduced to the logical expression $L*D$ (step 616), and the clear signal $C_0$ can be reduced to the logical expression $C+L*D'$ (step 618), then the asynchronous clear/asynchronous preset type flip-flop can be implemented according to step 620. In this case, the C signal is connected to the clear input terminal of the asynchronous clear/asynchronous load flip-flop, the L signal is connected to the asynchronous load input terminal of the asynchronous clear/asynchronous load flip-flop and the D input signal is connected to the asynchronous data input of the asynchronous clear/asynchronous load flip-flop.

In another case, if the clear and preset signals are both connected to the clear/preset flip-flop and the clear and preset input signals cannot be reduced to the aforementioned logical expressions or an equivalent permutation, the asynchronous clear/asynchronous preset flip-flop is converted to the clear/asynchronous load flip-flop according to step 622. $V_{cc}$ is connected to the asynchronous data input of the asynchronous clear/asynchronous load flip-flop and the preset signal of the asynchronous clear/asynchronous preset flip-flop is connected to the asynchronous load of the asynchronous clear/asynchronous load flip-flop.

To simplify the design process, it is desirable for the conversion process to be transparent to the hardware designer. To make the conversion transparent, a routine containing the conversion algorithm shown in FIG. 6 is applied to the AHDL file description of the asynchronous clear/asynchronous preset type flip-flop to change the configuration to an equivalent asynchronous clear/asynchronous load type flip-flop. Transparent to the designer, the file 510 containing a description of the asynchronous clear/asynchronous preset type flip-flop is mapped into a new file described in terms of an asynchronous clear/asynchronous load type flip-flop.

After the design is entered, the MAX+PLUS II software automatically translates the input files into logic equations, performs Boolean minimization, fits the design into the programmable logic device, and automatically partitions larger designs into multiple programmable logic devices. The resulting design is used to program the devices.

The algorithm shown in FIG. 6 is typically performed on a computer simulation system using MAX+PLUS II. Alternatively, a hardware designer may follow the steps shown in FIG. 6 to create breadboard models of an asynchronous clear/asynchronous load type flip-flop.

In summary, a novel technique has been described for conversion of clear and preset input signals to an asynchronous load signal for a storage device. As will be apparent to those skilled in the art, the above-described embodiment can be modified without departing from the scope of the invention. For example, the polarity of the clear, preset, data, and load signals may be changed from active high to active low without departing from the scope of the invention. It will be understood, therefore that the invention is defined not by the above description, but by the appended claims.

What is claimed is:

1. In a computer system having a processor and a memory, a method of converting a data representation of a first data storage circuit, said first data storage circuit having an asynchronous preset input terminal and an asynchronous clear input terminal, into a data representation of a second data circuit, said second data storage circuit having an asynchronous load input terminal, an asynchronous clear input terminal, and an asynchronous data input terminal, the method comprising the steps of:

storing the data representation of the first data storage circuit in said memory;

using the processor to determine the first input signals connected to the asynchronous preset input terminal and the asynchronous clear input terminal of the first data storage circuit;

using the processor to compare the first input signals against a set of predetermined input signal characteristics; and using the processor in response thereto to define a set of second input signals for at least said asynchronous load input terminal and said asynchronous clear input terminal of the second data storage circuit wherein the second input signals are logical combinations of the first input signals and logical constants thereby providing said data representation of the second data storage circuit.

2. A method as in claim 1 wherein said comparison indicates both an asynchronous clear signal and an asynchronous preset signal connected to the first data storage circuit.

3. The method according to claim 1 further comprising using said second data representation to program the programmable logic device.

4. In a computer system having a processor and a memory, a method of converting a data representation of a first data storage circuit, said first data storage circuit having an asynchronous preset input terminal and an asynchronous clear input terminal, into a data representation of a second data circuit, said second data storage circuit having an asynchronous load input terminal and an asynchronous clear input terminal, the method comprising the steps of:

storing the data representation of the first data storage circuit in said memory;

using the processor to determine the first input signals connected to the asynchronous preset input terminal and the asynchronous clear input terminal of the first data storage circuit;

using the processor to compare the first input signals against a set of predetermined input signal characteristics; and using the processor in response thereto to define a set of second input signals for at least said asynchronous load input terminal and said asynchronous clear input terminal of the second data storage circuit thereby providing said data representation of the second data storage circuit, wherein if the asynchronous preset signal $P_0$ can be reduced to the expression $(L*D)$ and the asynchronous clear signal $C_0$ can be reduced to the expression $(C+L*D')$ where the variables C, L, and D are logical subexpressions, the data representation of the first data storage circuit being modified to new representation by connecting C to the asynchronous clear input terminal of the representation of the second data storage circuit, connecting L to the asynchronous load input terminal of the representation of the second data storage circuit, and connecting D to the asynchronous data input terminal of the representation of the second data storage circuit.

5. A method as in claim 4 wherein if the asynchronous preset signal cannot be reduced to the expression L*D, the representation of the first data storage circuit is modified to a new representation by connecting a first voltage $V_{cc}$ to the asynchronous data input terminal of the representation of the second data storage circuit and connecting the asynchronous preset input signal of the representation of the first data storage circuit to the asynchronous load terminal of the representation of the second data storage circuit.

6. A method as in claim 4 wherein if the clear signal cannot be reduced to the expression (C+L*D'), the representation of the first data circuit is modified to a new representation by connecting a first voltage $V_{cc}$ to the asynchronous data input terminal and connecting the preset input signal of the representation of the first data circuit to the asynchronous load terminal of the new representation.

7. A method as in claim 4 wherein the variables C, L and D are logical subexpressions, wherein if the asynchronous preset signal $P_0$ can be reduced to a permutation equivalent to the expression (L*D) and the asynchronous clear signal $C_0$ can be reduced to a permutation equivalent to the expression (C+L*D), the representation of the first data storage circuit being modified to a new representation by connecting C to the asynchronous clear input terminal of the representation of the second data storage circuit, connecting L to the asynchronous load input terminal of the representation of the second data storage circuit and connecting D to the asynchronous data input terminal of the representation of the second data storage circuit.

8. A method as in claim 4 wherein the logical subexpressions C,L and D may be determined by the steps:

Letting $P_0$ be an active high preset signal;

Letting $C_0$ be an active high clear signal; and

Letting REDUCE(f,d) be a function that expands a Sum-Of-Products function f into a non-redundant set of prime implicants using a function d as a Don't Care set, wherein L is equal to REDUCE($P_0$, $C_0$), L' is the logical complement of L, D is equal to REDUCE($P_0$, L'), and C is equal to REDUCE($C_0$,L').

9. A method as in claim 8 wherein the function REDUCE (f,d) may be implemented by the steps of:

expanding the functions d and a function (f∪d) into prime implicants using the method of iterative consensus; and deleting from the expanded function (f∪d) those product terms appearing in the expanded function d.

10. In a computer system having a processor and a memory, a method of converting a data representation of a first data storage circuit having an asynchronous preset input terminal and an asynchronous clear input terminal, into a data representation of a second data circuit having an asynchronous load input terminal and an asynchronous clear input terminal, the method comprising the steps of:

storing the data representation of the first data storage circuit in said memory;

using the processor to determine the first input signals connected to the asynchronous preset input terminal and the asynchronous clear input terminal of the first data storage circuit;

using the processor to compare the first input signals against a set of predetermined input signal characteristics; and using the processor in response thereto to define a set of second input signals for at least said asynchronous load input terminal and said asynchronous clear input terminal of the second data storage circuit thereby providing said representation of the second data storage circuit wherein if the compare indicates an asynchronous preset signal connected to the asynchronous preset input terminal of the first data storage circuit and no asynchronous clear signal connected to the first data storage circuit, the data representation of the first data storage circuit is modified to a new representation by inverting both the output signal and the data input signal defined for the representation of the second data-storage circuit, disabling the load input terminal of the representation of the second data storage circuit, and connecting the asynchronous preset signal of the data representation of the first data storage circuit to the clear input terminal of the data representation of the second data storage circuit.

11. The method according to claim 10 further comprising using said second data representation to program a programmable logic device.

12. A method as in claim 11 wherein said comparison indicates both an asynchronous clear signal and an asynchronous preset signal connected to the first data storage circuit.

13. A method as in claim 12 wherein if the asynchronous preset signal $P_0$ can be reduced to the expression (L*D) and the asynchronous clear signal $C_0$ can be reduced to the expression (C+L*D') where the variables C, L, and D are logical subexpressions, the data representation of the first data storage circuit being modified to a new representation by connecting C to the asynchronous clear input terminal of the representation of the second data storage circuit, connecting L to the asynchronous load input terminal of the representation of the second data storage circuit, and connecting D to the asynchronous data input terminal of the representation of the second data storage circuit.

14. A method as in claim 12 wherein if the asynchronous preset signal cannot be reduced to the expression L*D, the representation of the first data storage circuit is modified to a new representation by connecting a first voltage $V_{cc}$ to the asynchronous data input terminal of the representation of the second data storage circuit and connecting the asynchronous preset input signal of the representation of the first data storage circuit to the asynchronous load of the representation of the second data storage circuit.

15. A method as in claim 12 wherein if the clear signal cannot be reduced to the expression (C+L*D'), the representation of the first data circuit is modified to a new representation by connecting a first voltage $V_{cc}$ to the asynchronous data input terminal and connecting the preset input signal of the representation of the first data circuit to the asynchronous load of the new representation.

16. A method as in claim 12 wherein the variables C, L and D are logical subexpressions, wherein if the asynchronous preset signal $P_0$ can be reduced to a permutation equivalent to the expression (L*D) and the asynchronous clear signal $C_0$ can be reduced to a permutation equivalent to the expression (C+L*D'), the representation of the first data storage circuit being modified to a new representation by connecting C to the asynchronous clear input terminal of the representation of the second data storage circuit, connecting L to the asynchronous load input terminal of the representation of the second data storage circuit and connecting D to the asynchronous data input terminal of the representation of the second data storage circuit.

17. A method as in claim 13 wherein the logical subexpressions C,L and D may be determined by the steps:

letting $P_0$ be an active high preset signal;

letting $C_0$ be an active high clear signal; and letting REDUCE(f,d) be a function that expands a Sum-Of-Products function f into a non-redundant set of prime implicants using a function d as a Don't Care set, wherein L is equal to REDUCE($P_0$, $C_0$), L' is the logical complement of L, D is equal to REDUCE($P_0$, L'), and C is equal to REDUCE($C_0$,L').

18. A method as in claim 17 wherein the function REDUCE(f,d) may be implemented by the steps of:

expanding the functions d and a function (f∪d) into prime implicants using the method of iterative consensus; and deleting from the expanded function (f∪d) those product terms appearing in the expanded function d.

* * * * *